(12) United States Patent
Kitten (10) Patent No.: US 8,379,410 B2
(45) Date of Patent: Feb. 19, 2013

(54) REVERSIBLE CABLE MANAGEMENT ARM

(75) Inventor: Chris Kitten, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 596 days.

(21) Appl. No.: 12/609,405

(22) Filed: Oct. 30, 2009

(65) Prior Publication Data

US 2011/0100933 A1 May 5, 2011

(51) Int. Cl.
*H02B 1/20* (2006.01)
*H02B 1/01* (2006.01)
*F16L 3/08* (2006.01)
*E04G 3/00* (2006.01)

(52) U.S. Cl. .......... 361/826; 361/825; 361/827; 248/70; 248/282.1; 174/70 A; 174/69; 211/26

(58) Field of Classification Search .......... 248/68.1, 248/70, 49, 74.1, 282.1; 174/69, 70, 72 A; 361/825, 826, 756, 727, 807, 810; 211/26, 211/183, 191, 175, 189, 190; 439/719
See application file for complete search history.

(56) References Cited

U.S. PATENT DOCUMENTS

| | | | | |
|---|---|---|---|---|
| 5,893,539 | A * | 4/1999 | Tran et al. | 248/68.1 |
| 6,435,354 | B1 * | 8/2002 | Gray et al. | 211/26 |
| 6,600,665 | B2 | 7/2003 | Lauchner | |
| 2004/0079711 | A1 * | 4/2004 | Hartman et al. | 211/26 |
| 2008/0093522 | A1 * | 4/2008 | Oddsen et al. | 248/276.1 |
| 2009/0014601 | A1 * | 1/2009 | Chen et al. | 248/70 |

FOREIGN PATENT DOCUMENTS

JP 3176451 U * 6/2012

* cited by examiner

*Primary Examiner* — Zachary M Pape
*Assistant Examiner* — Binh Tran
(74) *Attorney, Agent, or Firm* — Haynes and Boone, LLP

(57) ABSTRACT

A cable management arm system includes a rack and a pair of spaced apart support slides mounted on opposite sides of the rack. A first cable support arm is pivotably connected to a second cable support arm. A first arm attachment member is pivotably connected to the first cable support arm and a second arm attachment member is pivotably connected to the second cable support arm. Connector receivers are mounted on both sides of the rack. Snap-on connectors interconnect the attachment members and the connector receivers.

21 Claims, 9 Drawing Sheets

REVERSIBLE CABLE MANAGEMENT ARM

BACKGROUND

The present disclosure relates generally to information handling systems, and more particularly to a reversible cable management arm for use in such systems.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Server rack systems house multiple IHS chassis in a stacked configuration. Each chassis includes multiple cables attached to a rear surface of the chassis. The chassis are movably mounted to slide into and out of the rack, thus requiring a system to permit the attached cables to move with the chassis without binding while protecting the cables from damage. This has been accomplished by a cable management arm (CMA) assembly.

Existing solutions that incorporate spring biased hinges are not reversible, or require multiple parts to be disassembled and reconfigured on the CMA in order to change the attachment configuration.

Existing CMAs with spring biased hinges incorporate a mechanism that remains spring loaded when extended to the service position. This makes it difficult to service cables and other components located at the rear of the rack system.

Accordingly, it would be desirable to provide an improved reversible cable management arm absent the disadvantages discussed above. This disclosure allows a spring biased CMA to be converted from a right-hand attach configuration to a left-hand attach configuration (or vice-versa) in a quick, easy and conversionless manner without any removal and reconfiguration of any parts. This disclosure also incorporates bistable spring loaded mechanisms to allow the CMA to detent into the service position, making it easier to service from the back of the rack system.

SUMMARY

According to one embodiment, a cable management arm system includes a rack and a pair of spaced apart support slides mounted on opposite sides of the rack. A first cable support arm is pivotably connected to a second cable support arm. A first arm attachment member is pivotably connected to the first cable support arm and a second arm attachment member is pivotably connected to the second cable support arm. Connector receivers are mounted on both sides of the rack. Snap-on connectors interconnect the attachment members and the connector receivers.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
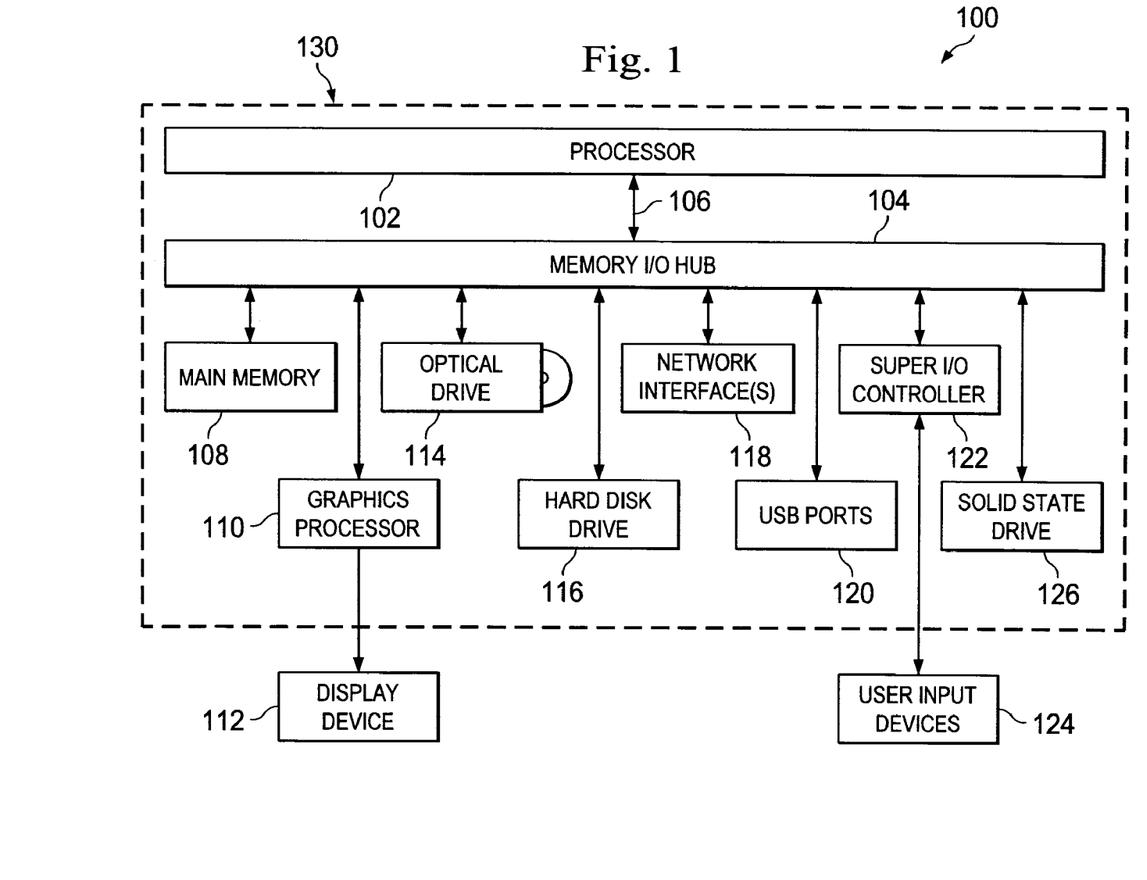
FIG. 1 is a diagrammatic view illustrating an embodiment of an IHS.

FIG. 1 is a block diagram of an IHS 100. The IHS 100 includes a processor 102 such as an Intel Pentium™ series processor or any other processor available. A memory I/O hub chipset 104 (comprising one or more integrated circuits) connects to processor 102 over a front-side bus 106. Memory I/O hub 104 provides the processor 102 with access to a variety of resources. Main memory 108 connects to memory I/O hub 104 over a memory or data bus. A graphics processor 110 also connects to memory I/O hub 104, allowing the graphics processor to communicate, e.g., with processor 102 and main memory 108. Graphics processor 110, in turn, provides display signals to a display device 112.

Other resources can also be coupled to the system through the memory I/O hub 104 using a data bus, including an optical drive 114 or other removable-media drive, one or more hard disk drives 116, one or more network interfaces 118, one or more Universal Serial Bus (USB) ports 120, and a super I/O controller 122 to provide access to user input devices 124, etc. The IHS 100 may also include a solid state drive (SSDs) 126 in place of, or in addition to main memory 108, the optical drive 114, and/or a hard disk drive 116. It is understood that any or all of the drive devices 114, 116 and 126 may be located locally with the IHS 100, located remotely from the IHS 100, and/or they may be virtual with respect to the IHS 100.

Portions of the system 100 are provided in an IHS chassis 130, FIG. 1. Other parts of the IHS 100 such as display 112 and input devices 124, such as a mouse and a keyboard for example are peripherally attached to the IHS 100.

Not all IHSs 100 include each of the components shown in FIG. 1, and other components not shown may exist. Furthermore, some components shown as separate may exist in an integrated package or be integrated in a common integrated circuit with other components, for example, the processor 102 and the memory I/O hub 104 can be combined together. As can be appreciated, many systems are expandable, and include or can include a variety of components, including redundant or parallel resources.

Figure 2:
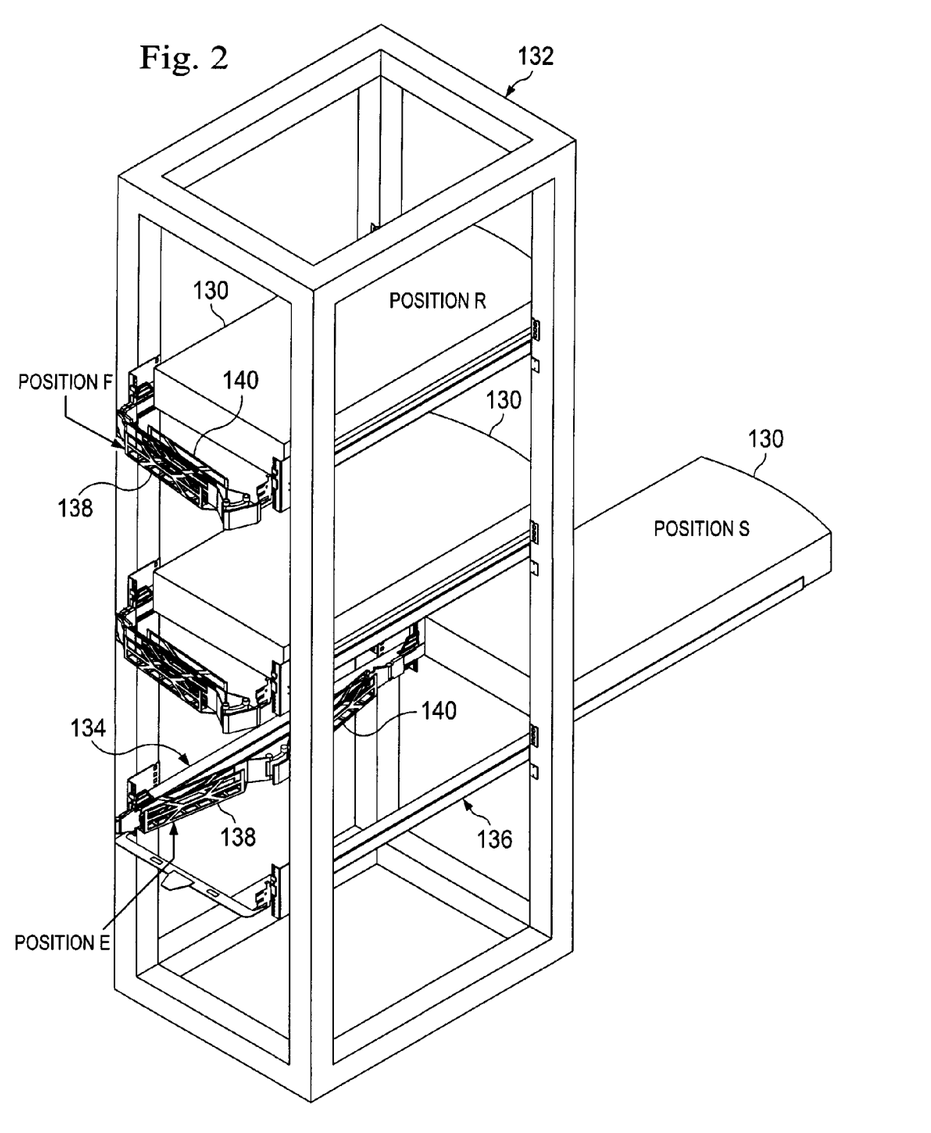
FIG. 2 is a perspective view illustrating an embodiment of a rack containing a stack of servers.

Some or all of the components in chassis 130 may be included in each chassis 130 mounted in a rack 132 in a stacked relationship, FIG. 2. In particular, each chassis 130 is a server in this embodiment. The chassis 130 are supported on a pair of first and a second spaced apart support slides 134, 136 positioned on opposite sides of the rack 132. The slides 134, 136 permit the chassis 130 to be positioned in a stored or retracted position R adjacent a rear of the rack 132, or in a service position S extended from a front of the rack 132.

Cable support arms 138, 140 are attached adjacent the rear of the rack 132 and to the chassis 130. The support arms 138, 140 are supported in a folded position F when the chassis 130 is retracted in the rack 132, and are connected to extend to an extended position E, with the chassis 130 in the service position S. The support arms 138, 140 support and protect cables 142 (FIG. 4) attached to the chassis 130 when the cables 142 move in the rack 132 in response to the movement of the chassis 130 between the retracted and service positions R and S, respectively.

Figure 5:
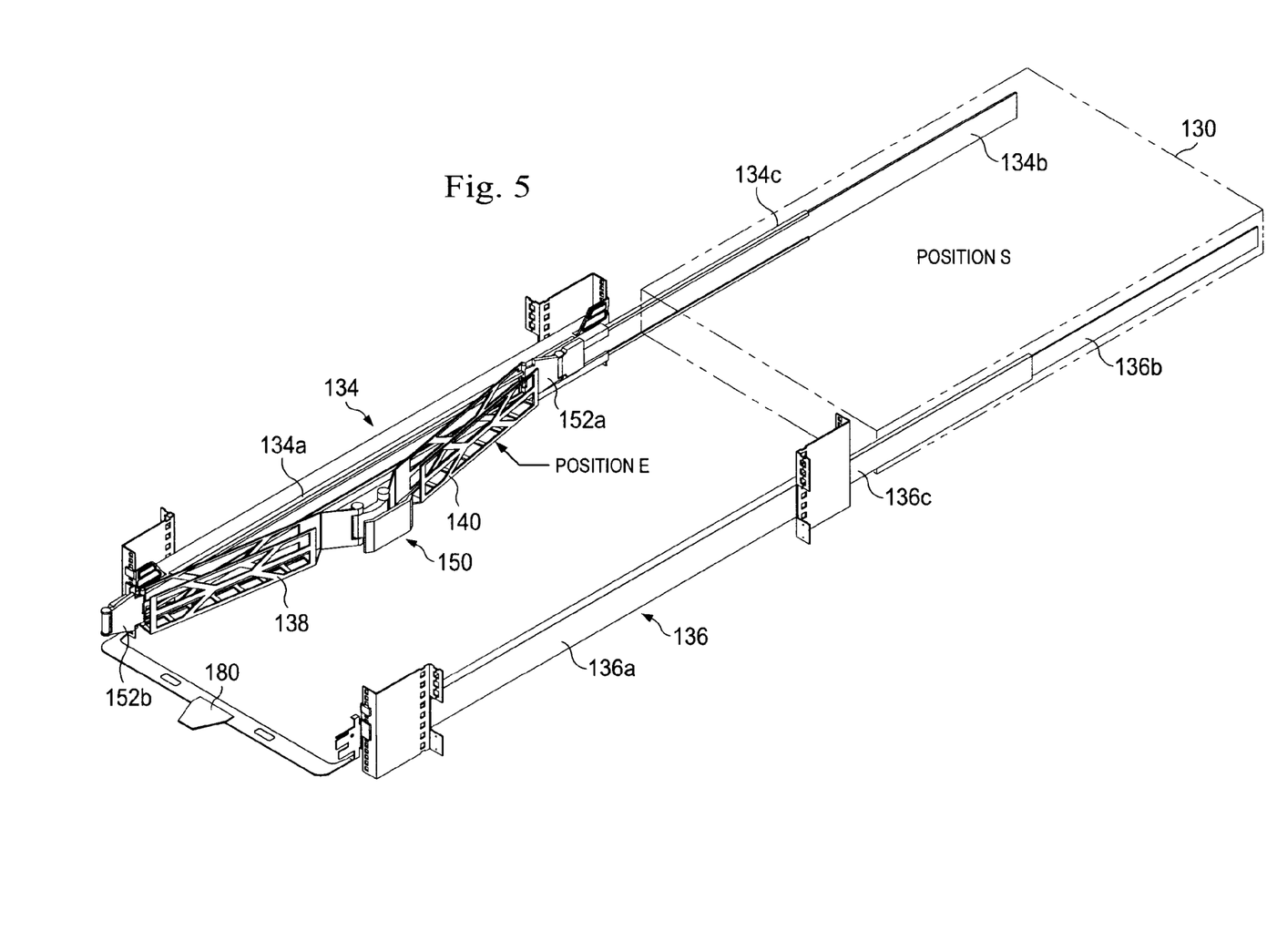

The slides 134, 136, FIG. 5, may include multiple slide members including a first slide member 134a, 136a being attached to be stationary with the rack 132 and a second slide member 134b, 136b being attached to move with the chassis 130 relative to the rack 132. An intermediate slide member 134c, 136c as shown in this embodiment, interconnects and moves relative to, the first and second slide members 134a, b and 136a, b, respectively.

Figure 3:
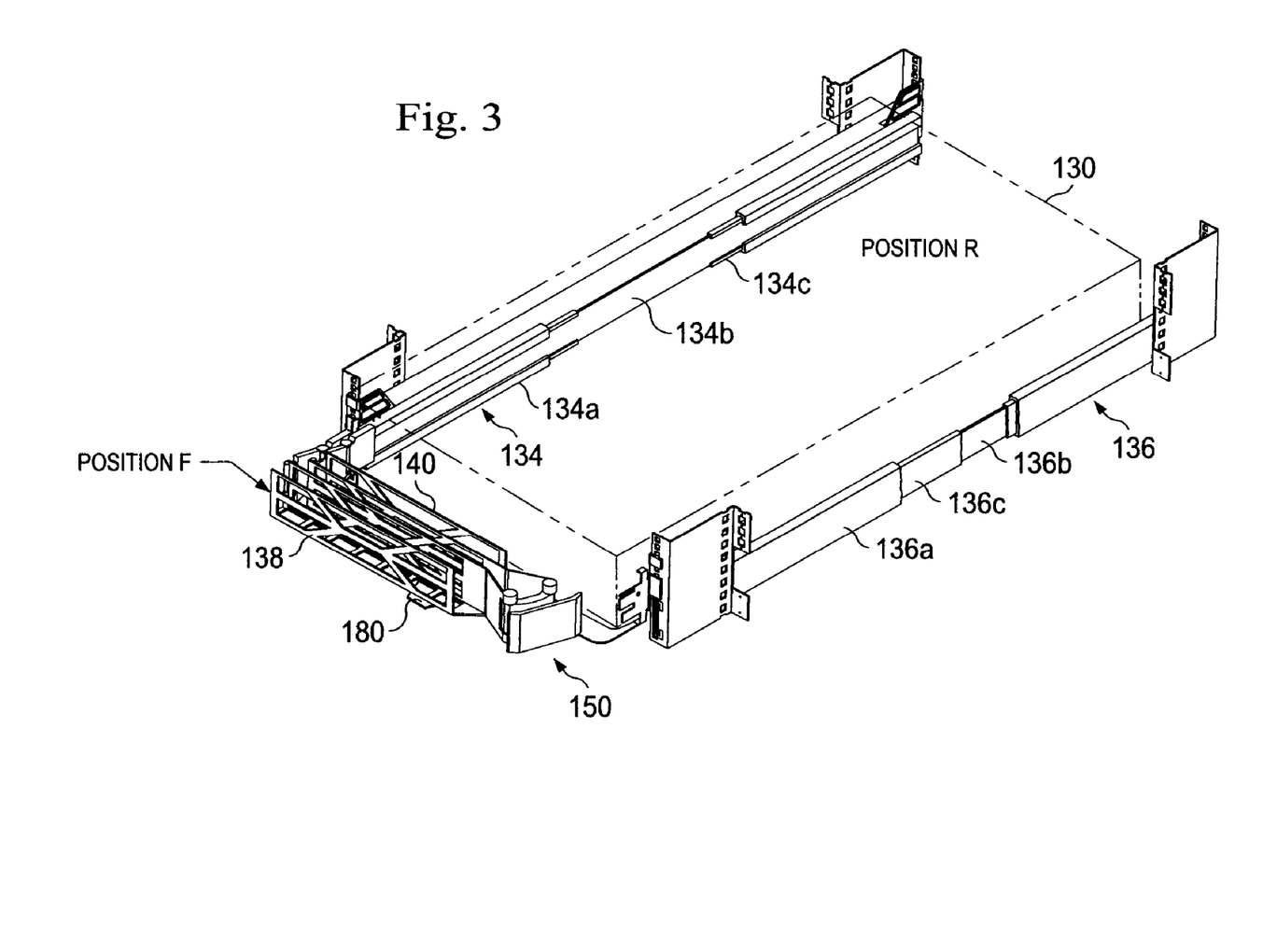
FIGS. 3, 4 and 5 are perspective views illustrating an embodiment of a slide device for use in a server rack.
Figure 4:
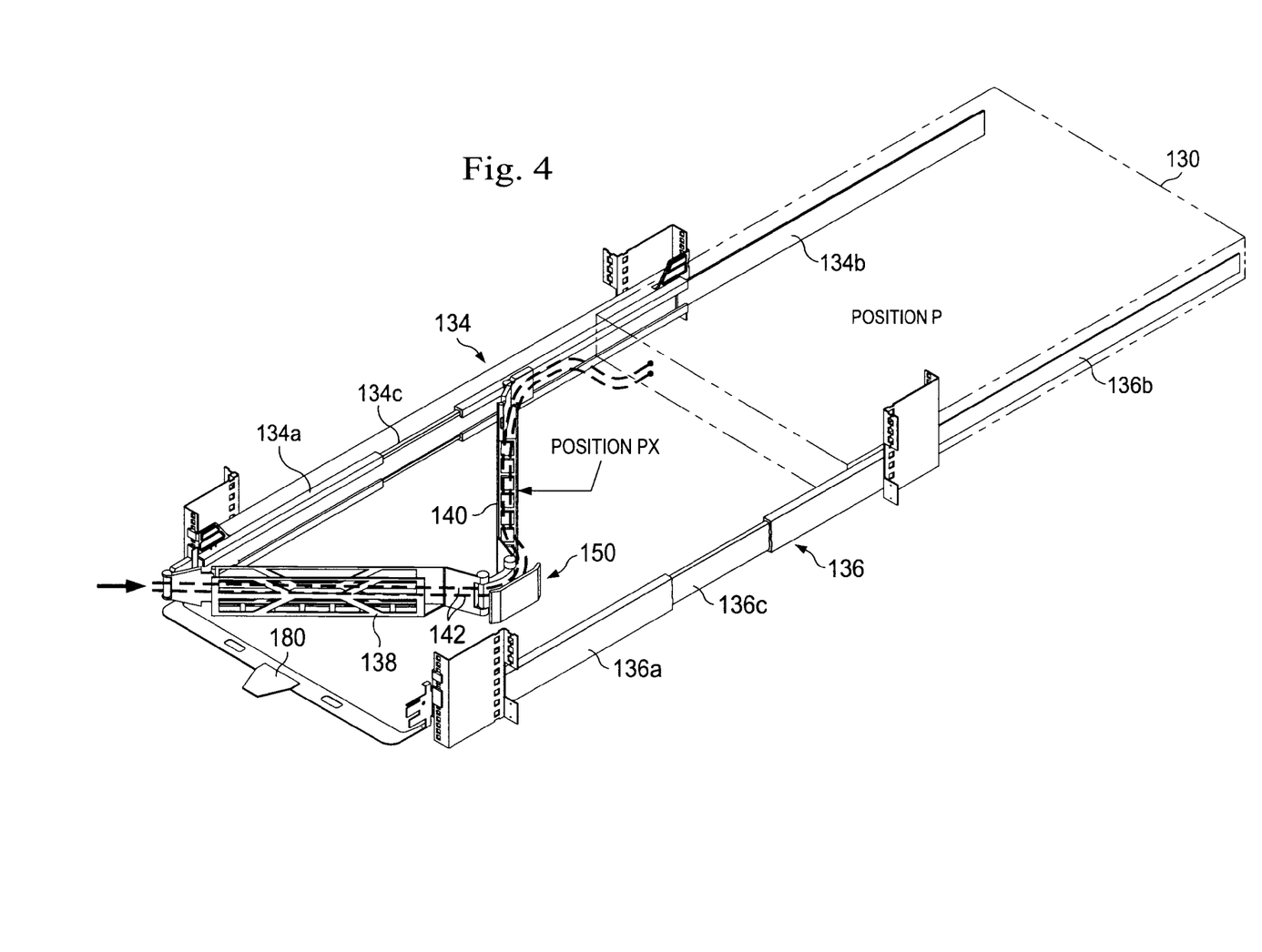

In further detail, the support slides 134a, b, c and 136a, b, c, FIGS. 3, 4 and 5 are illustrated carrying the chassis 130 from the retracted position R, FIG. 3, through a partially extended position P, FIG. 4, and finally to the fully extended service position S, FIG. 5. In this embodiment each slide 134, 136 includes the first slide member 134a, 136a, the second slide member 134b, 136b and the intermediate slide member 134c, 136c as mentioned above and best illustrated in FIG. 5. The cable support arms 138, 140 are shown in a folded position F, FIG. 3, a partially extended position, PX FIG. 4, and a fully extended position E, FIG. 5.

Figure 6:
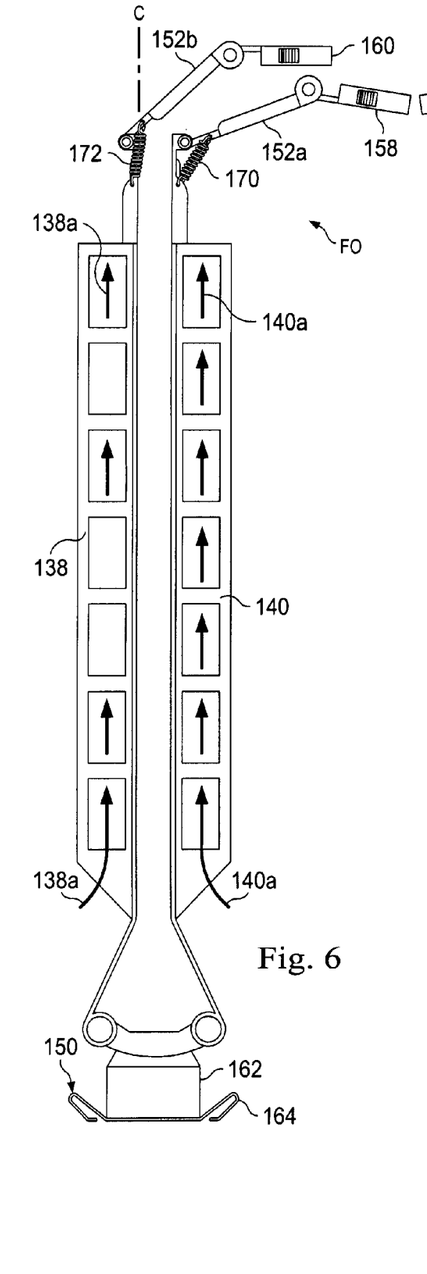
FIGS. 6 and 7 are top views illustrating an embodiment of cable management arms and associated connections.
Figure 7:
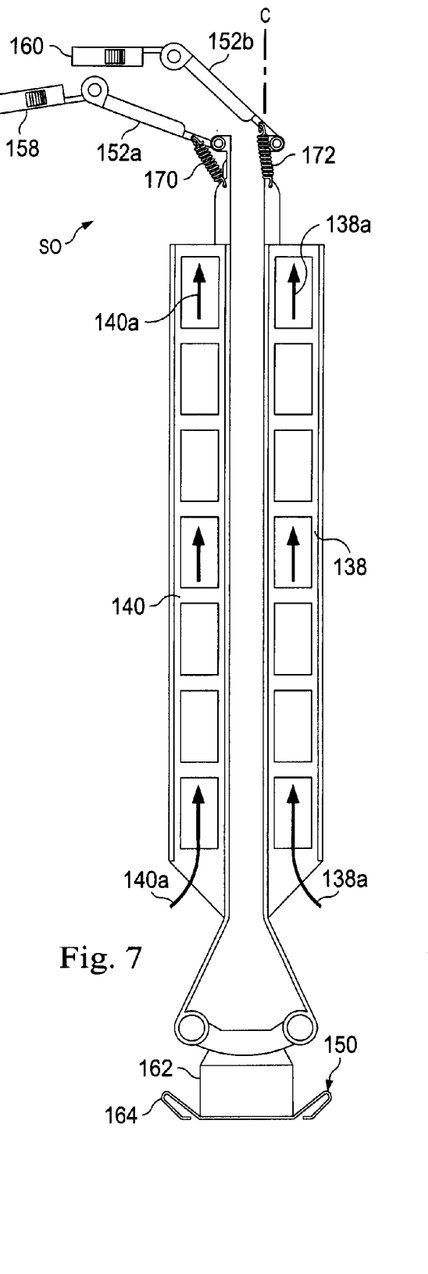

Referring to FIGS. 5, 6 and 7 the first cable support arm 140 is pivotably interconnected to the second cable support arm 138 at a pivotable connector 150. A first attachment member 152a is pivotably connected to the first cable support arm 140 and a second attachment member 152b is pivotably connected to the second cable support arm 138.

Figure 8:
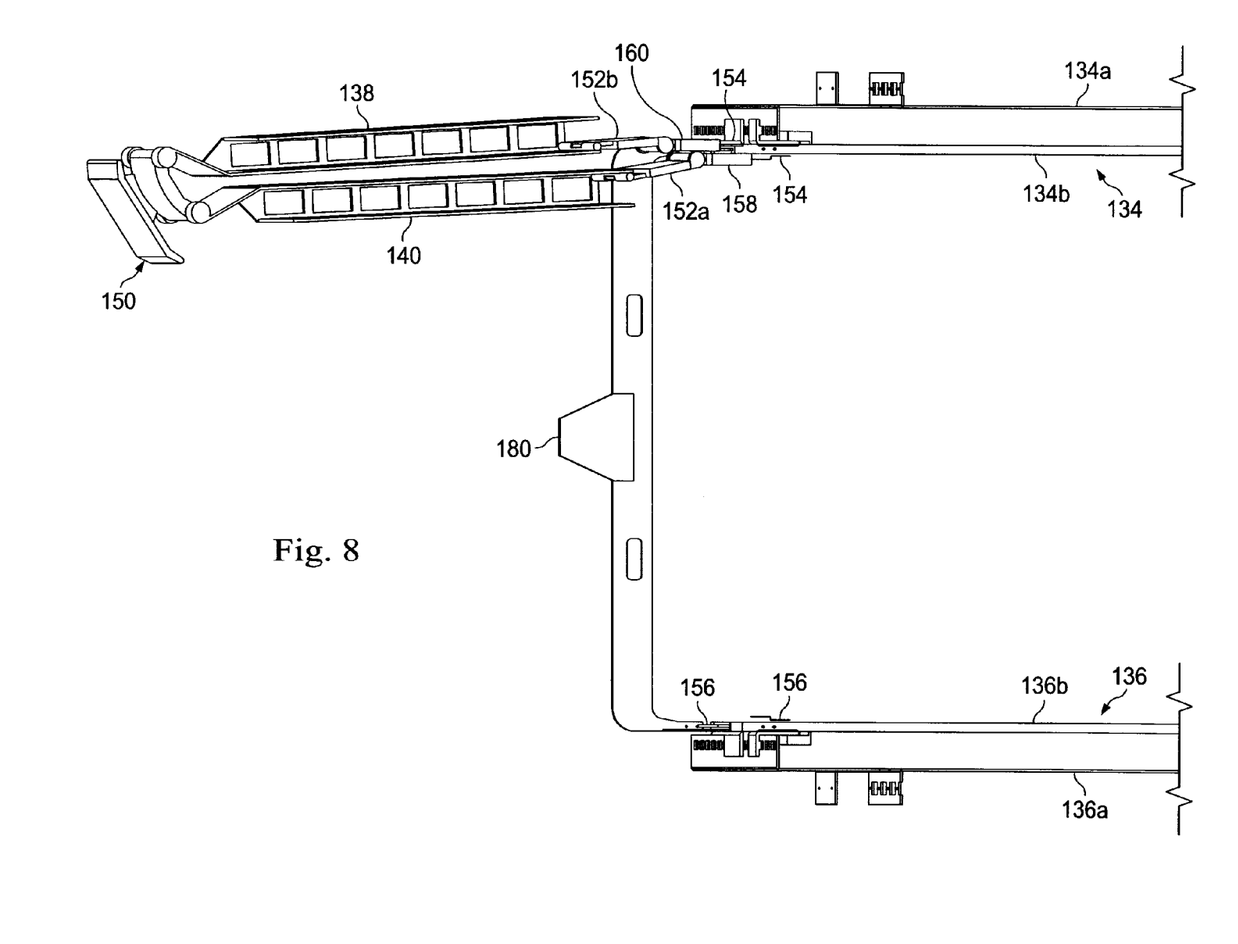
FIG. 8 is a partial top view illustrating the slide device of FIGS. 3, 4 and 5.
Figure 9:
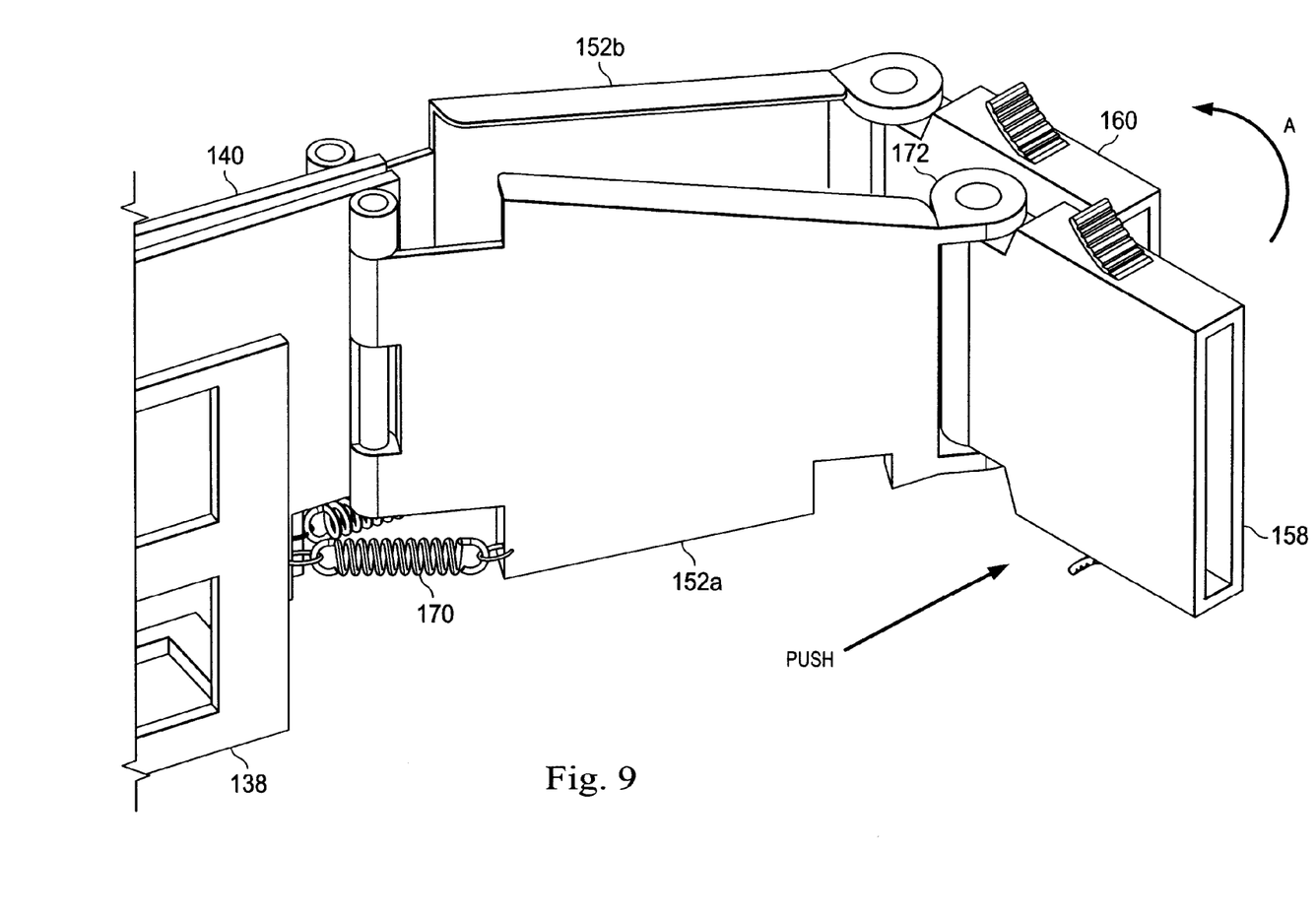
FIG. 9 is a perspective view illustrating an embodiment of the connections of the cable management arms of FIGS. 6 and 7.
Figure 10:
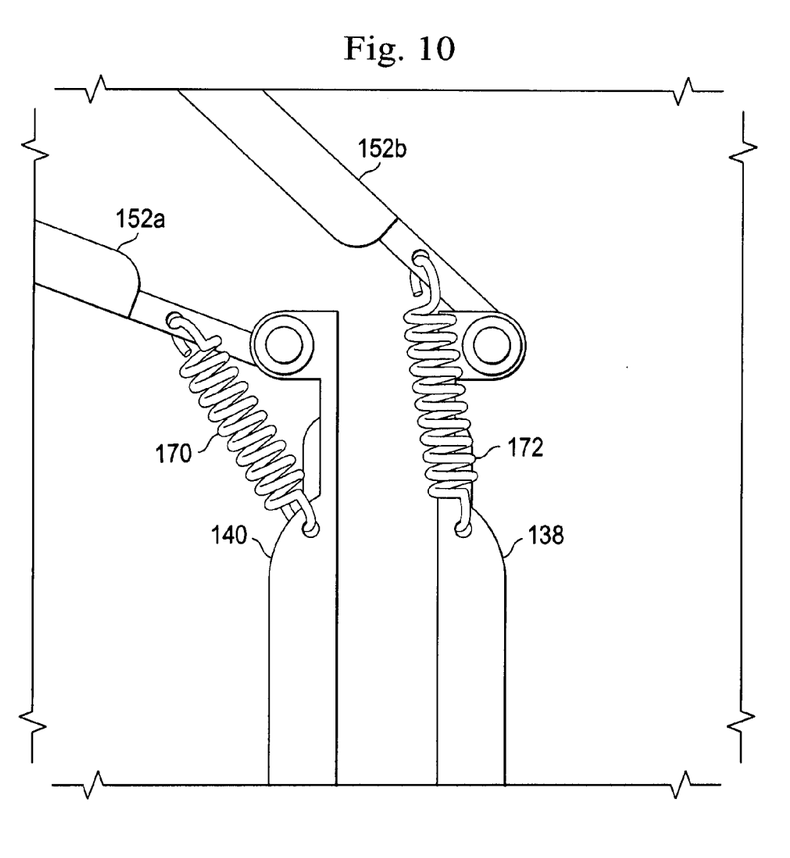
FIG. 10 is a partial perspective view of the connections of FIGS. 6, 7 and 9.

Best shown in FIG. 8, a first pair of connector receivers 154 are mounted on a first side of the rack 132 adjacent the first support slide 134, and a second pair of connector receivers 156 are mounted on a second side of the rack 132 adjacent the second support slide 136. Also, FIGS. 6, 7, 8 and 9, a pair of first and a second snap-on connectors 158, 160 are pivotably attached to the first and second attachment members 152a, 152b, respectively, and are releasably connected to the first pair of connector receivers 154. Specifically, the connector receivers 154 are provided for attachment to slide members 134a and b, and the connector receivers 156 are provided for attachment to slide members 136a and b.

In FIGS. 5 and 6, it is clearly illustrated that each of the cable support arms 138, 140 include a cable support channel 138a, 140a, respectively. Also, the pivotal connector 150 between the first and second cable support arms 138, 140 includes a channel 162 for supporting a cable or cables 142 and also includes a cable protecting member or shield 164.

In FIGS. 6, 7, 9 and 10, a first tension member 170 interconnects the first attachment member 152a and the first cable support arm 140. Similarly, a second tension member 172 interconnects the second attachment member 152b and the second cable support arm 138. Particularly in FIGS. 6 and 7, it can be seen that the tension members 170, 172 can control linkage behavior and maintain the feature of reversing the position of each attachment member and its respective snap-on connector relative to the respective cable support arm. For example, in FIG. 6, the attachment members 152a, b and respective snap-on connectors 158, 160 are in a first orientation FO, and in FIG. 7, the same attachment members 152a, b and snap-on connectors 158, 160 are in a second orientation SO which is opposite the first orientation FO. This is possible because the tension members 170, 172, respectively, maintain the attachment members 152a, b and snap-on connectors 158, 160 biased bi-directionally when pivoted over a centerline designated C relative to their respective cable support arms. Thus, for example, the snap-on connectors 158, 160 are in the first orientation FO for connection to the first pair of connector receivers 154, of slide 134, and are removable and pivoted to the second orientation SO for connection to the second pair of connector receivers 156 and slide 136 (see also FIG. 8). Thus, connection of the cable support arms 138, 140 is easily changed for connection to either slide 134 or 136. Furthermore, the bi-directional biasing caused by the tension members 170, 172 also assists in maintaining the arms 138, 140 in extended position E and chassis 130 in service position S until retracted (see FIG. 5).

In one example, FIGS. 2, 3, 4 and 5, the cable support arms 138, 140 are in the folded position F and the chassis is stored or retracted in position R in the rack. In this example, the cable support arms 138, 140 are connected to the first support slide 134 and rest on a cable arm rest 180 attached to the rack 132. The arms 138, 140 are movable to their extended position E along with the chassis 130 to its service position S. The chassis 130 can be returned to position R and the arms 138, 140 will fold as shown in FIG. 8. Manual pivoting of the arms 138, 140 to the folded position F resting on the cable arm rest 180, FIG. 3, can be accomplished. If it is desired to reverse the orientation of the arms 138, 140, as discussed above, the snap-on connectors 158, 160 and their respective attachment members 152a, b are moved along an arc A FIG. 9, from the first orientation FO, FIG. 6, to the second orientation SO, FIG. 7, for attachment to the second support slide 136 on the second side of the rack 132 opposite the first side.

As the cable support arms 138, 140 move from the folded position F to their extended position E and then return to the folded position F, the cables 142, FIG. 4, are carried and protected by the cable support channels 138a, 140a, and the channel 162 in the pivotal connector 150, FIGS. 6 and 7. Also, the cables 142 are further protected by the cable protecting member 164. This protection avoids chafing or scoring of the cables 142 during moving within the rack.

Although illustrative embodiments have been shown and described, a wide range of modification, change and substitution is contemplated in the foregoing disclosure and in some instances, some features of the embodiments may be employed without a corresponding use of other features.

Accordingly, it is appropriate that the appended claims be construed broadly and in a manner consistent with the scope of the embodiments disclosed herein.

What is claimed is:

1. A cable management arm system comprising:
a rack including:
a first support slides mounted on a first side of the rack and a second support slide mounted on a second side of the rack that is opposite the rack from the first side;
a first pair of connector receivers coupled to the first support slide on the first side of the rack; and
a second pair of connector receivers coupled to the second support slide on the second side of the rack;
a cable management arm that is operable to be coupled to the first side or the second side of the rack, the cable management arm including:
a first cable support arm pivotably connected to a second cable support arm;
a first attachment member pivotably connected to the first cable support arm;
a second attachment member pivotably connected to the second cable support arm;
a first tension member interconnecting the first attachment member and the first cable support arm;
a second tension member interconnecting the second attachment member and the second cable support arm; and
a first snap-on connector attached to the first attachment member and a second snap-on connector attached to the second attachment member
wherein the cable management arm is operable to be coupled to the first side of the rack in a first orientation by coupling the first snap-on connector and the second snap-on connector to the first pair of connector receivers, and wherein the first tension member and the second tension member bias the cable management arm into a folded position in the first orientation; and
wherein the cable management arm is operable to be coupled to the second side of the rack in a second orientation, in which the cable management arm is upside down relative to the first orientation, by coupling the first snap-on connector and the second snap-on connector to the second pair of connector receivers, and wherein the first tension member and the second tension member bias the cable management arm into the folded position in the second orientation.

2. The system of claim 1 wherein the first and second snap-on connectors are releasable from the first pair of connector receivers and re-attachable to the second pair of connector receivers.

3. The system of claim 1 wherein the first and second cable support arms include a channel for supporting a cable.

4. The system of claim 3 wherein the pivotal connection of the first and second cable support arms includes a channel for supporting the cable.

5. The system of claim 4 wherein the pivotal connection of the first and second cable support arms includes a cable protecting member.

6. The system of claim 1 further comprising:
a cable arm rest attached to the rack.

7. The system of claim 1 wherein the cable managment arm is movable between the folded position and an extended position, and wherein the first tension member and the second tension member assist in maintaining the cable managment arm in the extended position until the cable management arm is partially retracted such that the first tension member and the second tension member bias the cable management arm into the folded position.

8. An information handling system (IHS) comprising:
a rack including:
a first pair of connector receivers mounted to a first support slide on a first side of the rack;
a second pair of connector receivers mounted to a second support slide on a second side of the rack;
an IHS movably coupled to the rack;
a plurality of cables extending from the IHS;
a cable management arm coupled to the rack and housing the plurality of cables, the cable management arm including:
a first cable support arm pivotably connected to a second cable support arm;
a first attachment member pivotably connected to the first cable support arm;
a second attachment member pivotably connected to the second cable support arm;
a first tension member interconnecting the first attachment member and the first cable support arm;
a second tension member interconnecting the second attachment member and the second cable support arm; and
a first snap-on connector attached to the first attachment member and a second snap-on connector attached to the second attachment member;
wherein the cable management arm is operable house the plurality of cables by being coupled to the first side of the rack in a first orientation by coupling the first snap-on connector and the second snap-on connector to the first pair of connector receivers, and wherein the first tension member and the second tension member bias the cable management arm into a folded position in the first orientation; and
wherein the cable management arm is operable house the plurality of cables by being coupled to the second side of the rack in a second orientation, in which the cable management arm is upside down relative to the first orientation, by coupling the first snap-on connector and the second snap-on connector to the second pair of connector receivers, and wherein the first tension member and the second tension member bias the cable management arm into the folded position in the second orientation.

9. The system of claim 8 wherein the first and second snap-on connectors are releasable from the first pair of connector receivers and re-attachable to the second pair of connector receivers.

10. The system of claim 8 wherein the first and second cable support arms include a channel for supporting a cable.

11. The system of claim 10 wherein the pivotal connection of the first and second cable support arms includes a channel for supporting the cable.

12. The system of claim 11 wherein the pivotal connection of the first and second cable support arms includes a cable protecting member.

13. The system of claim 8 further comprising:
a cable arm rest attached to the rack.

14. The system of claim 8 wherein the cable managment arm is movable between the folded position and an extended position, and wherein the first tension member and the second tension member assist in maintaining the cable managment arm in the extended position until the cable management arm is partially retracted such that the first tension member and the second tension member bias the cable management arm into the folded position.

15. A method for managing cabling comprising:
providing a rack including a first pair of connector receivers mounted on a first support slide on a first side of the rack and a second pair of connector receivers mounted on a second support slide on a second side of the rack;
providing a cable management arm, wherein the cable management arm includes a first cable support arm pivotably coupled to a second cable support arm,
a first attachment member pivotably coupled to the first cable support arm,
a second attachment member pivotably coupled to the second cable support arm,
a first tension member extending between the first attachment member and the first cable support arm,
a second tension member extending between the second attachment member and the second cable support arm,
a first snap-on connector located on the first attachment member; and
a second snap-on connector located on the second attachment member;
coupling the cable management arm to the first side of the rack in a first orientation by coupling the first snap-on connector and the second snap-on connector to the first pair of connector receivers, and wherein the first tension member and the second tension member bias the cable management arm into a folded position in the first orientation; and
coupling the cable management arm to the second side of the rack in a second orientation, in which the cable management arm is upside down relative to the first orientation, by coupling the first snap-on connector and the second snap-on connector to the second pair of connector receivers, and wherein the first tension member and the second tension member bias the cable management arm into the folded position in the second orientation.

16. The method of claim 15 wherein the first and second snap-on connectors are releasable from the first pair of connector receivers and re-attachable to the second pair of connector receivers, whereby the first and second cable support arms are reversibly mounted in the rack.

17. The method of claim 15 wherein the first and second cable support arms include a channel for supporting a cable.

18. The method of claim 17 wherein the pivotal connection of the first and second cable support arms include a channel for supporting the cable.

19. The method of claim 18 wherein the pivotal connection of the first and second cable support arms includes a cable protecting member.

20. The method of claim 15 further comprising:
attaching a cable arm rest to the rack.

21. The method of claim 15 wherein the cable management arm is movable between the folded position and an extended position, and wherein the first tension member and the second tension member assist in maintaining the cable support arms in the extended position until the cable management arm is partially retracted such that the first tension member and the second tension member bias the cable management arm into the folded position.

* * * * *